(12) United States Patent
Kim

(10) Patent No.: US 6,864,126 B2
(45) Date of Patent: Mar. 8, 2005

(54) METHODS OF MANUFACTURING SEMICONDUCTOR DEVICES

(75) Inventor: Dae Kyeun Kim, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/747,830

(22) Filed: Dec. 29, 2003

(65) Prior Publication Data

US 2004/0147082 A1 Jul. 29, 2004

(30) Foreign Application Priority Data

Dec. 31, 2002 (KR) .................................. 10-2002-0087899

(51) Int. Cl.⁷ ..................... H01L 21/8238; H01L 21/28; H01L 21/44
(52) U.S. Cl. ..................... 438/142; 438/199; 438/583; 438/682
(58) Field of Search ................................. 438/142, 217, 438/199, 233, 231, 232, 301, 527, 533, 586, 682, 664, 649, 655

(56) References Cited

U.S. PATENT DOCUMENTS

| | | | | |
|---|---|---|---|---|
| 4,946,799 A | | 8/1990 | Blake et al. .................. 437/41 |
| 5,427,964 A | * | 6/1995 | Kaneshiro et al. .......... 438/231 |
| 5,508,212 A | * | 4/1996 | Wang et al. ................ 438/305 |
| 5,668,024 A | * | 9/1997 | Tsai et al. .................... 438/199 |
| 5,672,544 A | * | 9/1997 | Pan ............................. 438/305 |
| 5,744,395 A | * | 4/1998 | Shue et al. .................. 438/305 |
| 5,858,846 A | * | 1/1999 | Tsai et al. .................... 438/303 |
| 5,918,130 A | | 6/1999 | Hause et al. ................ 438/290 |
| 6,017,798 A | * | 1/2000 | Ilderem et al. ............. 438/286 |
| 6,057,185 A | * | 5/2000 | Suenaga ...................... 438/229 |
| 6,087,234 A | * | 7/2000 | Wu ............................. 438/299 |
| 6,087,235 A | | 7/2000 | Yu .............................. 438/300 |
| 6,096,591 A | * | 8/2000 | Gardner et al. ............. 438/238 |
| 6,163,059 A | * | 12/2000 | Hause et al. ................ 257/408 |
| 6,316,811 B1 | * | 11/2001 | Pey ............................. 257/368 |
| 6,465,294 B1 | * | 10/2002 | Tsai et al. .................... 438/217 |
| 6,521,540 B1 | | 2/2003 | Li ............................... 438/706 |

* cited by examiner

Primary Examiner—Matthew Smith
Assistant Examiner—Chuong Anh Luu
(74) Attorney, Agent, or Firm—Grossman & Flight, LLC

(57) ABSTRACT

A method of manufacturing a semiconductor device with a transistor comprising an LDD region and a silicide layer is disclosed. The method may include forming a gate electrode on a substrate, forming a first preliminary source/drain region with shallow junction through an ion implantation process using the gate electrode as a mask, and forming a ILD pattern with contact holes on the substrate including the gate electrode, the contact holes exposing the top of the gate electrode and some part of the first preliminary source/drain region. The method may also include forming an expanded source/drain region through an ion implantation process using the ILD pattern as a mask, forming a silicide layer on the top of the gate electrode and the expanded source/drain region, and forming contact plugs by filling the contact holes with metal.

12 Claims, 8 Drawing Sheets

US 6,864,126 B2

METHODS OF MANUFACTURING SEMICONDUCTOR DEVICES

TECHNICAL FIELD

The present disclosure relates to semiconductors and, more particularly, to method of manufacturing semiconductor devices.

BACKGROUND

Generally, in the manufacture of semiconductor devices, a transistor is fabricated according to following steps. First, a gate electrode is formed on a substrate and a source/drain region with shallow junction is formed through an ion implantation process using the gate electrode as a mask. Next, spacers are formed on sidewalls of the gate electrode and a source/drain region with deep junction is formed through an ion implantation using the spacers as a mask. As a result, a transistor comprising the gate electrode and an expanded source/drain region is formed in the substrate. The expanded source/drain region consists of the source/drain region with shallow junction as the lightly doped drain (LDD) region and the source/drain region with deep junction. Next, to reduce resistance during electrical operation of the transistor, a silicide layer is formed on the gate electrode and the surface of the substrate including the source/drain region. Here, the silicide layer is not formed on the spacers.

A prior approach is disclosed in U.S. Pat. No. 5,918,130 to Hause et al. that discloses a method for fabricating a transistor employing formation of silicide across a source/drain region prior to formation of the gate conductor. In particular, dopants are forwarded into a lateral region of a substrate to form an implant region. Then, a silicide layer and a sacrificial layer are formed respectively. A contiguous opening is formed through the sacrificial layer and the silicide layer, exposing a portion of the substrate. Dopants are then implanted into the exposed substrate region to form a channel. Spacers are formed on opposed sidewall surfaces of the sacrificial layer within the opening. A gate oxide is then formed across the exposed region, followed by the formation of a polysilicon gate conductor across the gate oxide. A polycide is formed across the gate conductor before the sacrificial layer is removed.

An alternate prior approach is disclosed in U.S. Pat. No. 6,087,235 to Yu, which discloses a method for fabricating a field effect transistor with elevated source/drain contact structures. A field effect transistor includes a drain extension implant, a source extension implant, a gate dielectric, a gate structure disposed over the gate dielectric, and a first spacer disposed on sidewalls of the gate dielectric and of the gate structure. An elevated drain contact structure is selectively grown on the drain extension implant and has a drain facetted surface facing toward the first spacer on the sidewall of the gate structure. Similarly, an elevated source contact structure is selectively grown on the source extension implant and has a source facetted surface facing toward the first spacer on the sidewall of the gate structure. A second spacer is formed to cover the drain facetted surface and the source facetted surface before dopant implantation into and silicide formation on the elevated drain and source contact structures.

FIGS. 1a through 1k illustrate, in cross-sectional views, the results of process steps for manufacturing a semiconductor device according to a known method.

Referring to FIG. 1a, a gate oxide layer 12 and a gate poly layer 14 are formed on a substrate 10 and a mask pattern 15 is formed over the gate poly layer 14.

Referring to FIG. 1b, the gate oxide layer 12 and the gate poly layer 14 are etched using the mask pattern 15 as an etching mask to form a gate electrode 16 comprising a gate poly pattern 14a and a gate oxide pattern 12a.

As shown in FIG. 1c, an ion implantation is performed using the gate electrode 16 as a mask to form a source/drain region 18 with shallow junction adjacent to the gate electrode 16 in the substrate 10.

Referring to FIG. 1d, an insulating layer is deposited over the substrate 10 including the gate electrode 16. Then, an etch back process is performed for the insulating layer to form spacers 20 on sidewalls of the gate electrode 16.

Referring to FIG. 1e, an ion implantation is performed using the spacers 20 as a mask to form a source/drain region 22 with deep junction adjacent to the spacers 20 in the substrate 10. As a result, an expanded source/drain region 24 with an LDD region is formed in the substrate 10.

With reference to FIG. 1f, a metal layer 26 is formed over the substrate 10 including the gate electrode 16 and the spacers 20. The metal layer 26 is a multi-layer consisting of a titanium layer and a titanium nitride layer.

Referring to FIG. 1g, a first thermal treatment process is performed for the substrate 10 including the metal layer 26. By the thermal treatment, salicidation reaction occurs. As a result, a preliminary silicide layer 28a is formed on top of the gate electrode 16 and the surface of the substrate 10 including the source/drain region 24. However, the salicidation reaction does not occur in the metal layer 26 on the spacers 20 and, therefore, the preliminary silicide layer 28a is not formed on the spacers 20. The metal layer 26 unchanged on the spacers 20 is removed.

Referring to FIG. 1h, a second thermal treatment process is performed for the substrate 10 including the preliminary silicide layer 28a. As a result, the preliminary silicide layer 28a is changed into a silicide layer 28.

Referring to FIG. 1i, an insulating layer pattern 30 with contact holes 30a is formed over the substrate 10 including the silicide layer 28. Through the contact holes 30a, the silicide layer 28 on the gate electrode and some part of the silicide layer 28 on the substrate 10 including the source/drain region 24 are exposed.

Referring to FIGS. 1j and 1k, a barrier metal layer 32 is formed on bottom and sidewalls of the contact holes 30a. Then, the contact holes 30a are filled with conductive material and an etch back process is performed to form contact plugs.

Here, the spacers function as a mask for ion implantation. In addition, the silicide layer is not formed on the spacers. Such spacers are a necessary structure in manufacturing a semiconductor device but are unnecessary in respect of device operation. Particularly, the spacers may cause leakage during device operation. To obviate these shortcomings, a process omitting formation of the spacers has been developed. However, such a conventional method may increase electrical resistance in a device.

DETAILED DESCRIPTION

Figure 1A:
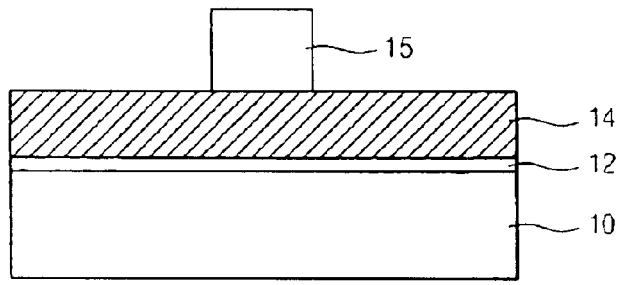
FIGS. 1a through 1k illustrate, in cross-sectional views, results of the process steps for fabricating a semiconductor device according to a known method.
Figure 1B:
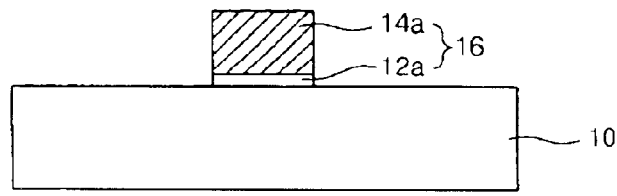
Figure 1C:
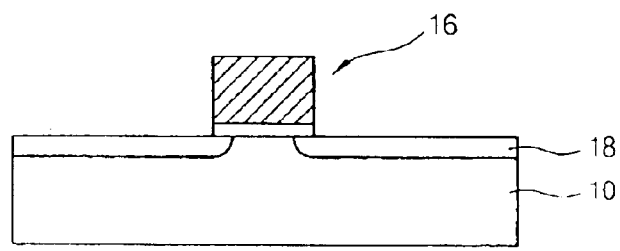
Figure 1D:
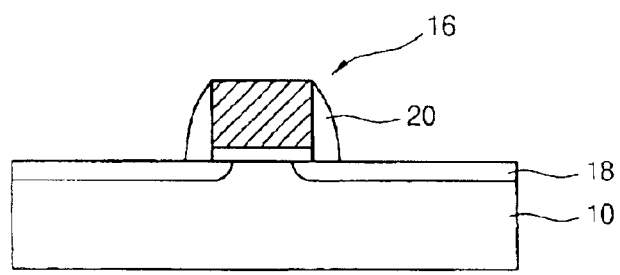
Figure 1E:
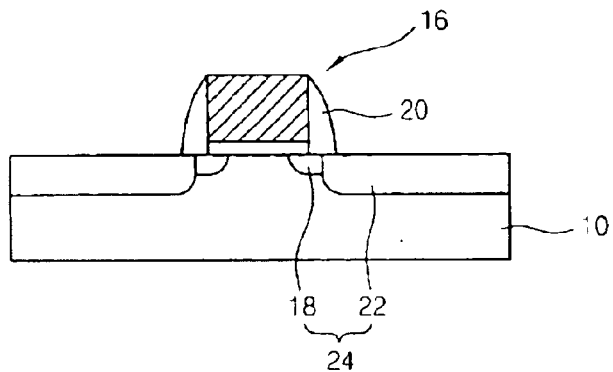
Figure 1F:
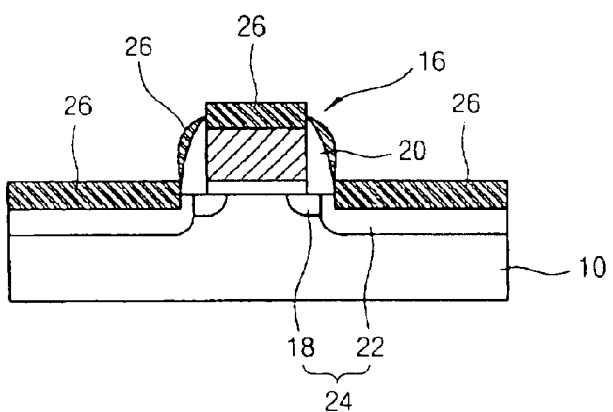
Figure 1G:
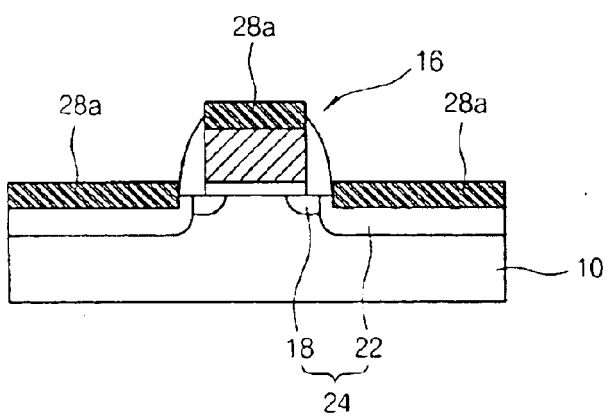
Figure 1H:
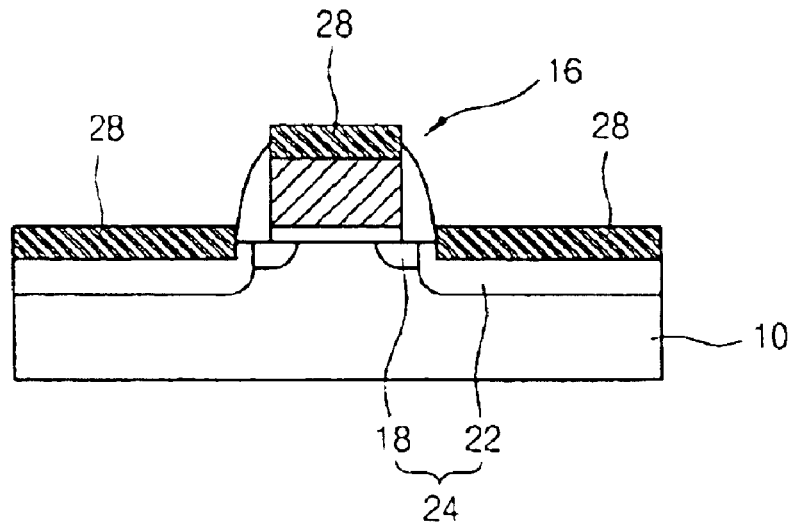
Figure 1I:
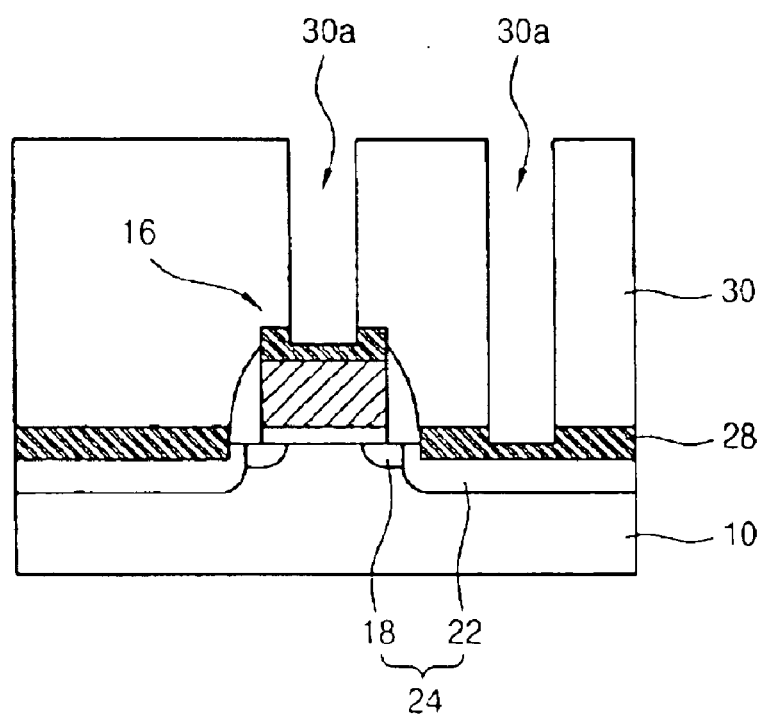
Figure 1J:
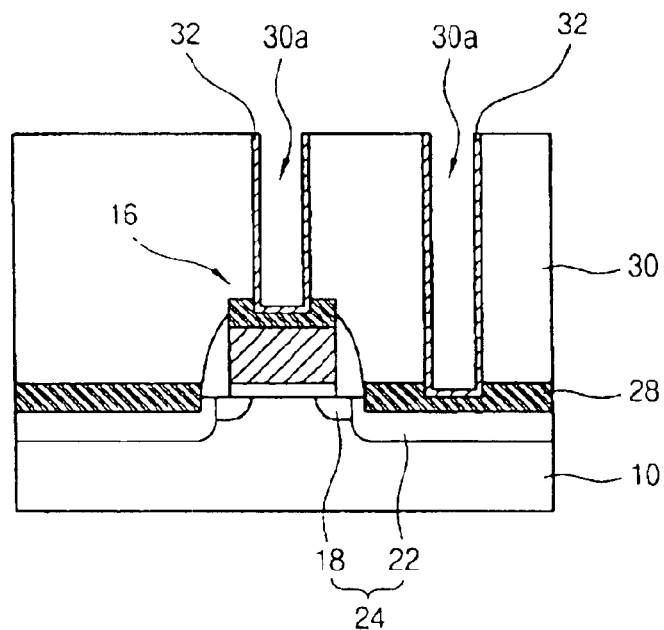
Figure 1K:
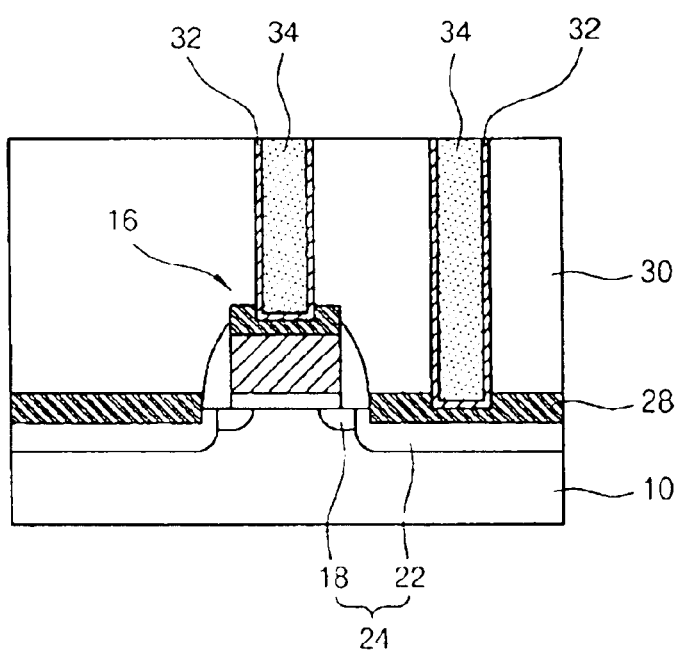
Figure 2A:
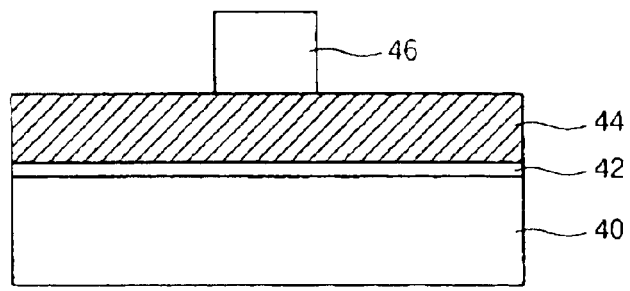
FIGS. 2a through 2j illustrate, in cross-sectional views, results of example disclosed process steps for fabricating a semiconductor device.

Referring to FIG. 2a, a gate oxide layer 42 and a gate poly layer 44 are formed in sequence on a substrate 40. A mask layer 46 is formed over the gate poly layer 44. The mask layer 46 is preferably a photoresist pattern formed by photolithography.

Figure 2B:
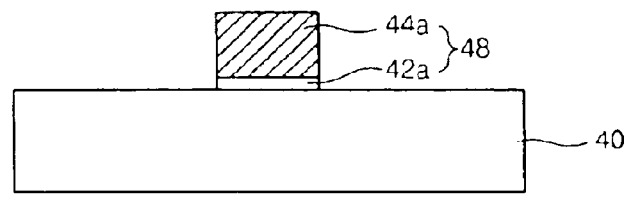

As shown in FIG. 2b, an etching process is performed using the mask layer 46 as an etching mask to form a gate poly pattern 44a and a gate oxide pattern 42a The mask layer 46 is removed. As a result, a gate electrode 48 comprising the gate oxide pattern 42a and the gate poly pattern 44a is formed on the substrate 40.

Figure 2C:
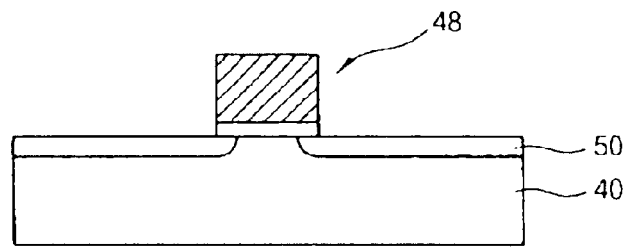

Referring to FIG. 2c, an ion implantation process is performed using the gate electrode 48 as a mask. As a result, a first preliminary source/drain region 50 with shallow junction is formed adjacent to the gate electrode 48 in the substrate 40.

Figure 2D:
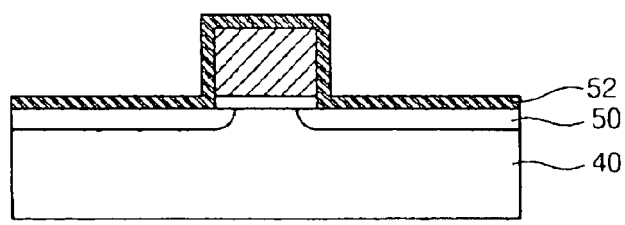

Referring to FIG. 2d, a nitride layer 52 is formed on the substrate 40 including the gate electrode 48. The nitride layer 52 is preferably about 300 Å in thickness and is formed to ensure a margin for misalign when an ILD pattern with contact holes is formed in a following process.

Figure 2E:
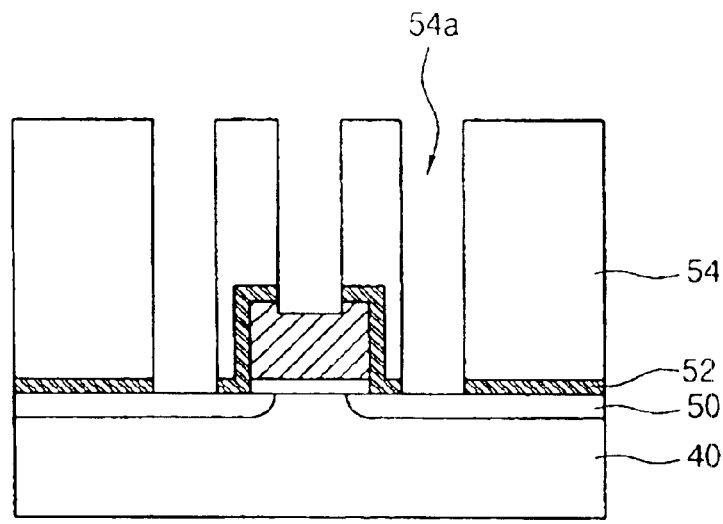

Referring to FIG. 2e, an ILD pattern 54 with contact holes 54a is formed over the substrate 40. Through the contact holes 54a, the top of the gate electrode 48 and some part of the first preliminary source/drain region 50 are exposed. In particular, an ILD is formed on the substrate 40. The ILD may be formed of borophosphosilicate glass (BPSG) or tetraethyl or thosilicate (TEOS) and may be a single layer or a multi-layer. Then, a planarization process such as chemical mechanical polishing (CMP) is performed to flatten the surface of the ILD. Then, a photoresist pattern is formed on the ILD. An etching process is performed using the photoresist pattern as an etching mask to form an ILD pattern 54 with contact holes 54a.

Figure 2F:
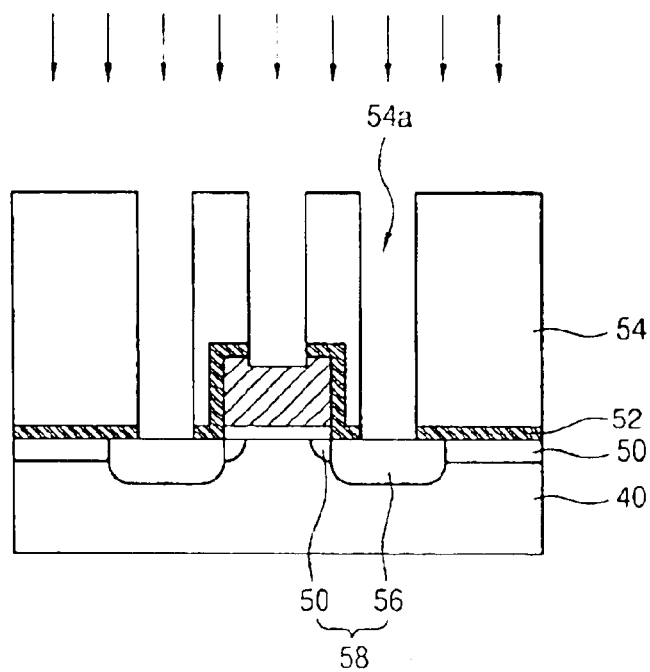

Referring to FIG. 2f, an ion implantation process is performed using the ILD pattern 54 as a mask to implant ions into the parts exposed through the contact holes 54a. By the ion implantation, a second preliminary source/drain region 56 with deep junction is formed in the substrate 40. As a result, an expanded source/drain region 58 with an LDD region is formed in the substrate 40. The expanded source/drain region includes the first preliminary source/drain region 50 and the second preliminary source/drain region 56. In addition, the ion implantation results in an increase of doping concentration in the gate electrode 48. Therefore, electric resistance of the gate electrode 48 can be reduced due to such an increase of doping concentration.

Figure 2G:
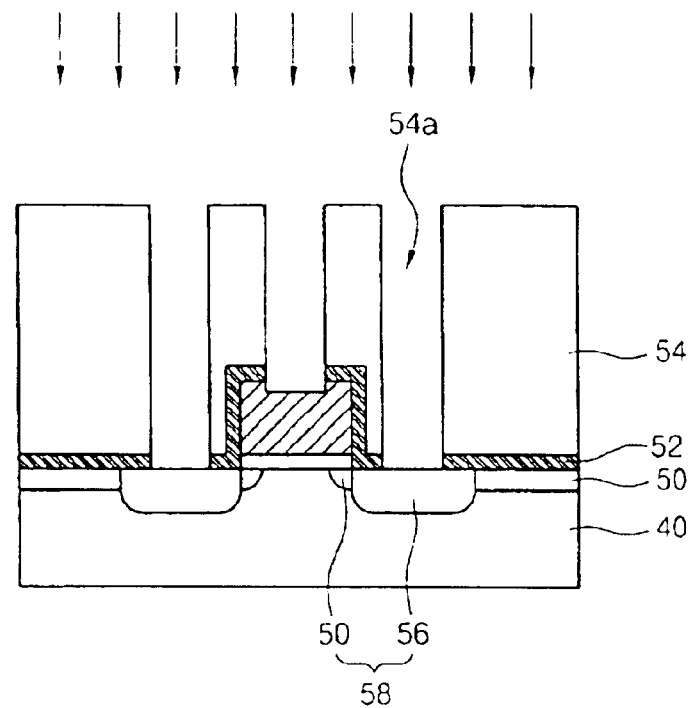

Referring to FIG. 2g, the ion implantation process may be continuously performed until the parts exposed through the contact holes 54a have a single crystal structure.

Figure 2H:
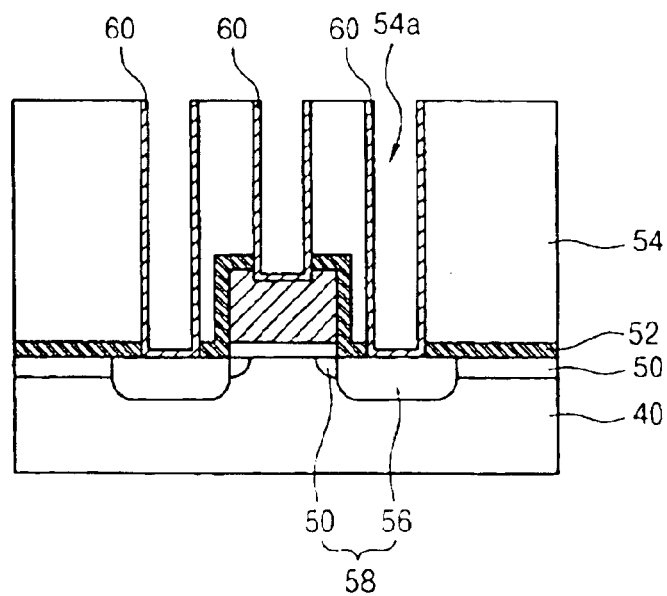

Referring to FIG. 2h, a barrier metal layer 60 is formed on sidewalls and bottoms of the contact holes 54a. The barrier metal layer 60 may be formed of titanium, titanium nitride, or cobalt. Alternatively, the barrier metal layer 60 a multi-layer structure comprising a titanium layer and a titanium nitride layer or a cobalt layer, a titanium layer and a titanium nitride layer.

Figure 2I:
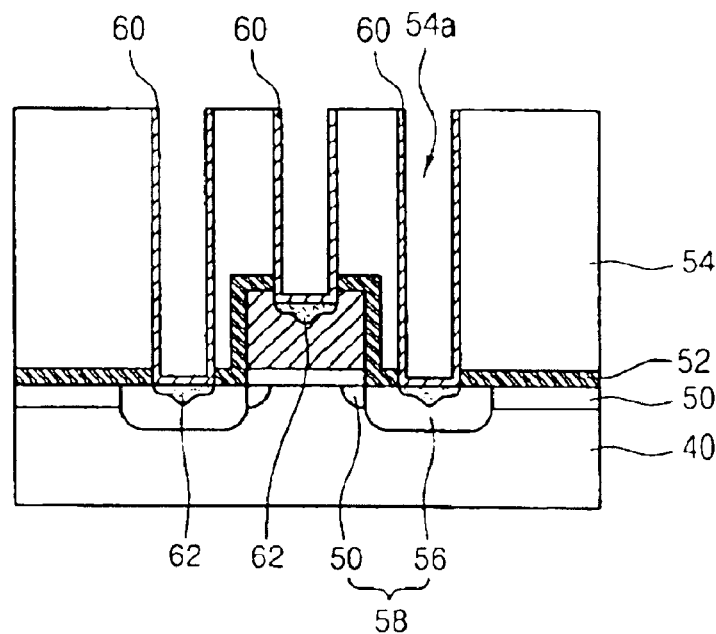

Referring to FIG. 2i, a silicide layer 62 is formed on the bottoms of the contact holes 54a through thermal treatment of the substrate 40. The silicide layer 62 is formed using the barrier metal layer 60. In one example, the formation of the barrier metal layer 60 may be omitted. Therefore, if the barrier metal layer is not formed in the contact holes 54a, a metal layer is deposited only on the bottoms of the contact holes 54a to form the silicide layer 62 through a thermal treatment process. Here, the metal layer may be formed of titanium, titanium nitride, or cobalt. Alternatively, the metal layer may be a multi-layer structure comprising a titanium layer and a titanium nitride layer or a cobalt layer, a titanium layer, and a titanium nitride layer. Thus, to simplify the process, the silicide layer 62 may be formed using the barrier metal layer 60.

The process for forming the silicide layer 62 is now described in detail. First, a metal layer is formed on the top of the gate electrode 48 and the surface of the substrate 40 including the expanded source/drain region 58. A first thermal treatment process is performed for the substrate 40 including the metal layer. Then, a second thermal treatment process is performed for the substrate 40 in situ. As a result, the metal layer is changed into the silicide layer 62 by salicidation reaction. In one example, the metal layer may be the barrier metal layer 60.

In one example, if the metal layer for the formation of the silicide layer 62 is a multi-layer comprising a titanium layer and a titanium nitride layer, the titanium layer may be about 300 Å in thickness and the titanium nitride layer may be about 150 Å in thickness. In addition, in case of the metal layer comprising the titanium layer and the titanium nitride layer, the first thermal treatment may be performed using a nitrogen gas for about 30 seconds at temperature of about 720° C. and the second thermal treatment may be performed using a nitrogen gas for about 20 seconds at temperature of about 820° C.

According to another example, if the metal layer for the formation of the silicide layer 62 is a multi-layer comprising a cobalt layer, a titanium layer, and a titanium nitride layer, the cobalt layer, the titanium layer, and the titanium nitride layer may be about 150 Å, 100 Å, and 150 Å in thickness, respectively. In addition, in case of the metal layer comprising the cobalt layer, the titanium layer, and the titanium nitride layer, the first thermal treatment may be performed using a nitrogen gas for a time between about 50 seconds and 70 seconds at a temperature between about 460° C. and 500° C. The second thermal treatment may be performed using a nitrogen gas for a time between about 25 seconds and 35 seconds at a temperature between about 800° C. and 840° C.

Figure 2J:
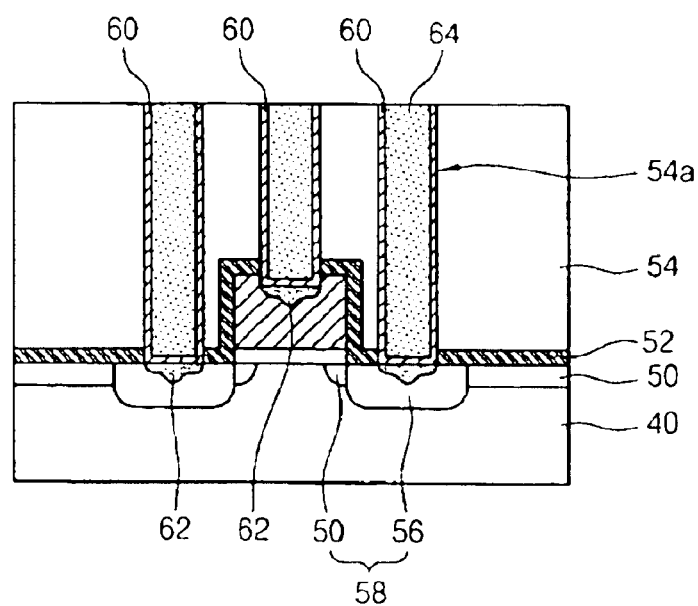

Referring to FIG. 2j, the contact holes 54a are filled with conductive material to form contact plugs 64. The conductive material may be, for example, tungsten material that has good filling properties. In particular, the conductive material is deposited over the ILD pattern 54 and in the contact holes 54a. A planarization process such as CMP is performed until the surface of the ILD pattern 54 is exposed. As a result, the conductive material remains in the contact holes 54a to form the contact plugs 64.

Next, a metal interconnect is formed over the ILD pattern 54 including the contact plugs 64. Thus, the contact plugs 64 are electrically connected by the metal interconnect.

As disclosed herein, a semiconductor device may include an LDD region and a silicide layer without spacers. In addition, the present invention can improve operation characteristics as well as electrical characteristics of device in manufacturing semiconductor devices such as SRAM.

As disclosed herein, one example method of manufacturing a semiconductor device includes forming a gate electrode on a substrate, forming a first preliminary source/drain region with shallow junction in the substrate by performing ion implantation using the gate electrode as a mask, and forming an interlayer dielectric (ILD) pattern with contact holes over the substrate including the gate electrode and the first preliminary source/drain region, the contact holes exposing the top of the gate electrode and some part of the first preliminary source/drain region. The example method may further include forming an expanded source/drain region by performing an ion implantation using the ILD pattern as a mask, the expanded source/drain region including the first preliminary source/drain region with shallow junction as the LDD region and a second preliminary source/drain region with deep junction, forming a silicide layer on the top of the gate electrode and the expanded source/drain region and forming contact plugs by filling the contact holes with metal.

An alternate example method may include forming a nitride layer with a thickness between 250 Å and 350 Å over the substrate including the gate electrode; and forming a barrier metal layer on sidewalls and bottoms of the contact holes.

The silicide layer may be formed by forming a metal layer on the top of the gate electrode and the surface of the substrate including the expanded source/drain region, performing a first thermal treatment process for the substrate including the metal layer, and performing a second thermal treatment process in situ for the resulting substrate.

The metal layer for formation of the silicide layer is preferably formed of one selected form the group consisting of titanium, titanium nitride, and cobalt.

According to another example, the metal layer for formation of the silicide layer may be a multi-layer consisting of a titanium layer and a titanium nitride layer. The titanium layer may be between 250 Å and 350 Å in thickness. Alternatively, the titanium nitride layer may be between 100 Å and 200 Å in thickness. The first thermal treatment may be performed using a nitrogen gas for a time between 25 seconds and 35 seconds at a temperature between 700° C. and 740° C. The second thermal treatment may be performed using a nitrogen gas for a time between 15 seconds and 25 seconds at a temperature between 800° C. and 840° C.

The metal layer for formation of the silicide layer may be a multi-layer consisting of a cobalt layer, a titanium layer, and a titanium nitride layer. Alternatively, the cobalt layer may be between 120 Å and 170 Å in thickness. The titanium layer may be 80 Å and 120 Å in thickness. The titanium nitride layer may be 130 Å and 170 Å in thickness. The first thermal treatment may be preformed using a nitrogen gas for a time between 50 seconds and 70 seconds at a temperature between 460° C. and 500° C. The second thermal treatment may be performed using a nitrogen gas for a time between 25 seconds and 35 seconds at a temperature between 800° C. and 840° C.

In any of the foregoing embodiments, the contact plugs may be tungsten and a metal interconnect deposited over the ILD pattern including the contact plugs may be formed of aluminum.

Although certain example methods are disclosed herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for manufacturing a semiconductor device comprising:
    forming a gate electrode on a substrate;
    forming a first preliminary source/drain region with shallow junction in the substrate by performing ion implantation using the gate electrode as a mask;
    forming an interlayer dielectric (ILD) pattern with contact holes over the substrate including the gate electrode and the first preliminary source/drain region, the contact holes exposing the top of the gate electrode and some part of the first preliminary source/drain region;
    forming an expanded source/drain region by performing an ion implantation using the ILD pattern as a mask, the expanded source/drain region including the first preliminary source/drain region with shallow junction as the LDD region and a second preliminary source/drain region with deep junction;
    forming a silicide layer on the top of the gate electrode and the expanded source/drain region; and
    forming contact plugs by filling the contact holes with metal.

2. A method as defined by claim 1, further comprising forming a nitride layer with a thickness between 250 Å and 350 Å over the substrate including the gate electrode.

3. A method as defined by claim 1, further comprising forming a barrier metal layer on bottoms and sidewalls of the contact holes.

4. A method as defined by claim 1, wherein the silicide layer is formed by:
    forming a metal layer on the top of the gate electrode and the expanded source/drain region;
    performing a first thermal treatment of the substrate including the metal layer, and
    performing a second thermal treatment in situ of the resulting substrate.

5. A method as defined by claim 4, wherein the metal layer is formed of at least one selected from the group consisting of a titanium layer, a titanium nitride layer, and a cobalt layer.

6. A method as defined by claim 4, wherein the metal layer is a multi-layer comprising a titanium layer and a titanium nitride layer.

7. A method as defined by claim 6, wherein the titanium layer has a thickness between 250 Å and 350 Å and the titanium nitride has a thickness between 100 Å and 200 Å.

8. A method as defined by claim 6, wherein the metal layer is treated by first and second thermal treatment processes, the first thermal treatment process using a nitrogen gas for a time between 25 seconds and 35 seconds at a temperature between 700° C. and 740° C., the second thermal treatment process using a nitrogen gas for a time between 15 seconds and 25 seconds at a temperature between 800° C. and 840° C.

9. A method as defined by claim 4, wherein the metal layer is a multi-layer comprising a cobalt layer, a titanium layer, and a titanium nitride layer.

10. A method as defined by claim 9, wherein the cobalt layer has a thickness between 120 Å and 170 Å, the titanium layer has a thickness between 80 Å and 120 Å, and the titanium nitride layer has a thickness between 130 Å and 170 Å.

11. A method as defined by claim 9, wherein the metal layer is treated by first and second thermal treatment processes, the first thermal treatment process using a nitrogen gas for a time between 50 seconds and 70 seconds at a temperature between 460° C. and 500° C., the second thermal treatment process using a nitrogen gas for a time between 25 seconds and 35 seconds at a temperature between 800° C. and 840° C.

12. A method as defined by claim 1, wherein the contact plugs are formed of tungsten.

* * * * *